United States Patent
Ting et al.

(10) Patent No.: US 7,618,856 B2
(45) Date of Patent: Nov. 17, 2009

(54) METHOD FOR FABRICATING STRAINED-SILICON CMOS TRANSISTORS

(75) Inventors: Shyh-Fann Ting, Kao-Hsiung Hsien (TW); Cheng-Tung Huang, Kao-Hsiung (TW); Jing-Chang Wu, Yun-Lin Hsien (TW); Kun-Hsien Lee, Tai-Nan (TW); Wen-Han Hung, Kao-Hsiung (TW); Li-Shian Jeng, Tai-Tung Hsien (TW); Tzer-Min Shen, Hsin-Chu (TW); Tzyy-Ming Cheng, Hsin-Chu (TW); Nien-Chung Li, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 403 days.

(21) Appl. No.: 11/566,688

(22) Filed: Dec. 5, 2006

(65) Prior Publication Data

US 2007/0128783 A1 Jun. 7, 2007

Related U.S. Application Data

(60) Provisional application No. 60/742,573, filed on Dec. 6, 2005, provisional application No. 60/766,956, filed on Feb. 22, 2006.

(51) Int. Cl.
 *H01L 21/8238* (2006.01)
(52) U.S. Cl. ............... 438/222; 438/300; 257/E21.634
(58) Field of Classification Search ............... 438/222, 438/226, 300; 257/E21.634
See application file for complete search history.

(56) References Cited

U.S. PATENT DOCUMENTS

| 6,165,826 A | * | 12/2000 | Chau et al. ............... 438/231 |
| 7,442,967 B2 | | 10/2008 | Ko |
| 7,452,764 B2 | | 11/2008 | Hoffmann |
| 2005/0266632 A1 | | 12/2005 | Chen |

FOREIGN PATENT DOCUMENTS

| TW | 1227058 | 1/2005 |
| TW | 1230460 | 4/2005 |
| TW | 1256129 | 6/2006 |

* cited by examiner

*Primary Examiner*—Chandra Chaudhari
(74) *Attorney, Agent, or Firm*—Winston Hsu

(57) ABSTRACT

A semiconductor substrate having a first active region and a second active region for fabricating a first transistor and a second transistor is provided. A first gate structure and a second gate structure are formed on the first active region and the second active region and a first spacer is formed surrounding the first gate structure and the second gate structure. A source/drain region for the first transistor and the second transistor is formed. The first spacer is removed from the first gate structure and the second gate structure and a cap layer is disposed on the first transistor and the second transistor and the cap layer covering the second transistor is removed thereafter. An etching process is performed to form a recess in the substrate surrounding the second gate structure. An epitaxial layer is formed in the recess and the cap layer is removed from the first transistor.

21 Claims, 20 Drawing Sheets

METHOD FOR FABRICATING STRAINED-SILICON CMOS TRANSISTORS

CROSS REFERENCE TO RELATED APPLICATIONS

This application claims the benefit of the filing date of U.S. provisional patent application No. 60/742,573 (filed Dec. 6, 2005) and U.S. provisional patent application No. 60/766,956 (filed Feb. 22, 2006), the contents of which are hereby incorporated by reference.

BACKGROUND OF THE INVENTION

1. Field of the Invention

The invention relates to a method for fabricating strained-silicon CMOS transistors.

2. Description of the Prior Art

The performance of MOS transistors has increased year after year with the diminution of critical dimensions and the advance of large-scale integrated circuits (LSI). However, it has been recently pointed out that the miniaturization attained by a lithographic technology has reached its limit. Therefore, how to improve the carrier mobility so as to increase the speed performance of MOS transistors has become a major topic for study in the semiconductor field. For the known arts, attempts have been made to use a strained silicon layer, which has been grown epitaxially on a silicon substrate with a silicon germanium (SiGe) layer disposed therebetween. In this type of MOS transistor, a biaxial tensile strain occurs in the epitaxy silicon layer due to the silicon germanium which has a larger lattice constant than silicon, and, as a result, the band structure alters, and the carrier mobility increases. This enhances the speed performance of the MOS transistors.

Please refer to FIGS. 1-4. FIGS. 1-4 are perspective diagrams illustrating a method for fabricating a strained-silicon CMOS transistor according to the prior art. As shown in FIG. 1, a semiconductor substrate 100 having an NMOS region 102 and a PMOS region 104 is provided, in which the NMOS region 102 and the PMOS region 104 are separated by a shallow trench isolation 106. Each of the NMOS region 102 and the PMOS region 104 includes a gate structure. The NMOS gate structure includes an NMOS gate 108 and a gate dielectric 114 disposed between the NMOS gate 108 and the semiconductor substrate 100. The PMOS gate structure includes a PMOS gate 110 and a gate dielectric 114 disposed between the PMOS gate 110 and the semiconductor substrate 100. The sidewall of the NMOS gate 108 and the PMOS gate 110 includes an offset spacer 112 composed of silicon oxide or silicon nitride.

Next, an ion implantation process is performed to form a lightly doped drain 118 and 119 in the semiconductor substrate 100 surrounding the NMOS gate 108 and the PMOS gate 110, and a spacer 113 is form on the sidewall of the NMOS gate 108 and the PMOS gate 110 thereafter. Next, another ion implantation process is performed to form a source/drain region 116 around the NMOS gate 108 and a source/drain region 117 around the PMOS gate 110 within the semiconductor substrate 100. A rapid thermal annealing process is performed thereafter to use a temperature between 900° C. to 1050° C. to activate the dopants within the source/drain region 116 and 117 and repair the lattice structure of the semiconductor substrate 100 which has been damaged during the ion implantation process. An NMOS transistor 132 and a PMOS transistor 134 are thus formed in the NMOS region 102 and the PMOS region 104 respectively.

As shown in FIG. 2, an etching process is performed by using the gate structures of the NMOS region 102 and the PMOS region 104 as a mask to form a recess 120 in the corresponding semiconductor substrate 100 not covered by the NMOS gate 108 and the PMOS gate 110. After the recess 120 is formed, as shown in FIG. 3, a selective epitaxial growth process is conducted to form an epitaxial layer 122 in the recess 120 of the NMOS region 102 and the PMOS region 104. The epitaxial layer 122 is preferably composed of silicon germanium.

Next, as shown in FIG. 4, a metal layer (not shown) composed of nickel is disposed on the NMOS transistor 132 and the PMOS transistor 134, and a rapid thermal annealing process is performed to react the metal layer with the NMOS gate 108, the PMOS gate 110, and the source/drain region 116 and 117 to form a plurality of salicide layers 115.

In light of the above, the conventional method for fabricating a strained-silicon CMOS transistor usually forms a spacer on the sidewall of the gate, and deposits an epitaxial layer in the semiconductor substrate with respect to the source/drain region of the NMOS region and the PMOS region. This approach allows the silicon germanium contained in the epitaxial layer to facilitate the carrier mobility of the transistor. However, due to the position of the spacer, the effect of silicon germanium imposed on the channel region is degraded, thereby limiting the performance of the CMOS transistor.

SUMMARY OF THE INVENTION

It is an objective of the present invention to provide a method for fabricating a strained-silicon CMOS transistor to improve the aforementioned problems.

First, a semiconductor substrate having a first active region for fabricating a first transistor and a second active region for fabricating a second transistor is provided, in which the first active region and the second active region are separated by an isolation structure. Next, a first gate structure and a second gate structure are formed on the first active region and the second active region, and a first spacer is formed surrounding the first gate structure and the second gate structure. Next, a source/drain region is formed for the first transistor and the second transistor, and the first spacer is removed from the first gate structure and the second gate structure. A cap layer is disposed on the first transistor and the second transistor thereafter, and the cap layer covering the second transistor is removed. Next, an etching process is performed to form a recess on the second gate structure and in the semiconductor substrate surrounding the second gate structure. Subsequently, a selective epitaxial growth process is performed to form an epitaxial layer in the recess and the cap layer is removed from the surface of the first transistor thereafter.

Specifically, the present invention provides a method for fabricating a strained-silicon CMOS transistor, in which a stress layer and an epitaxial layer are both utilized to increase the performance of the NMOS transistor and the PMOS transistor. Preferably, a stress layer can be first deposited on the NMOS transistor and the PMOS transistor, and after removing the stress layer from the PMOS transistor, a recess is formed in the corresponding source/drain region of the PMOS transistor. Subsequently, an epitaxial layer is formed in the recess, such that while the stress layer is used to facilitate the electron mobility of the NMOS transistor, the epitaxial layer is used to enhance the hole mobility of the PMOS transistor. According to another aspect of the present invention, the spacer can also be removed from the gate structure of each transistor prior to the formation of the stress layer. By utilizing this approach, the stress layer and the epitaxial layer can be formed much closer to the channel region of each transistor, thereby further increasing the stress being applied on each transistor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
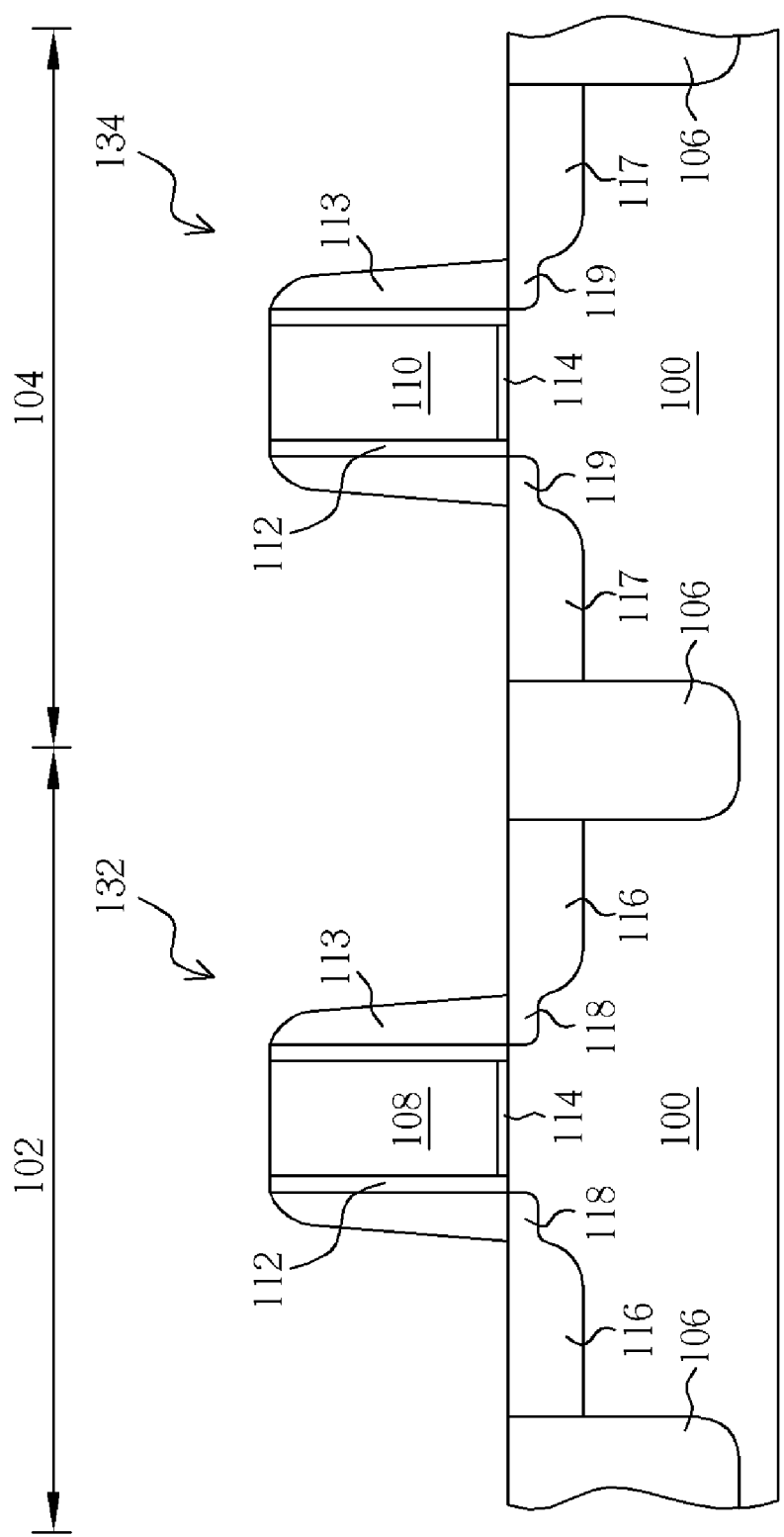
FIGS. 1-4 are perspective diagrams illustrating a method for fabricating a strained-silicon CMOS transistor according to the prior art.
Figure 2:
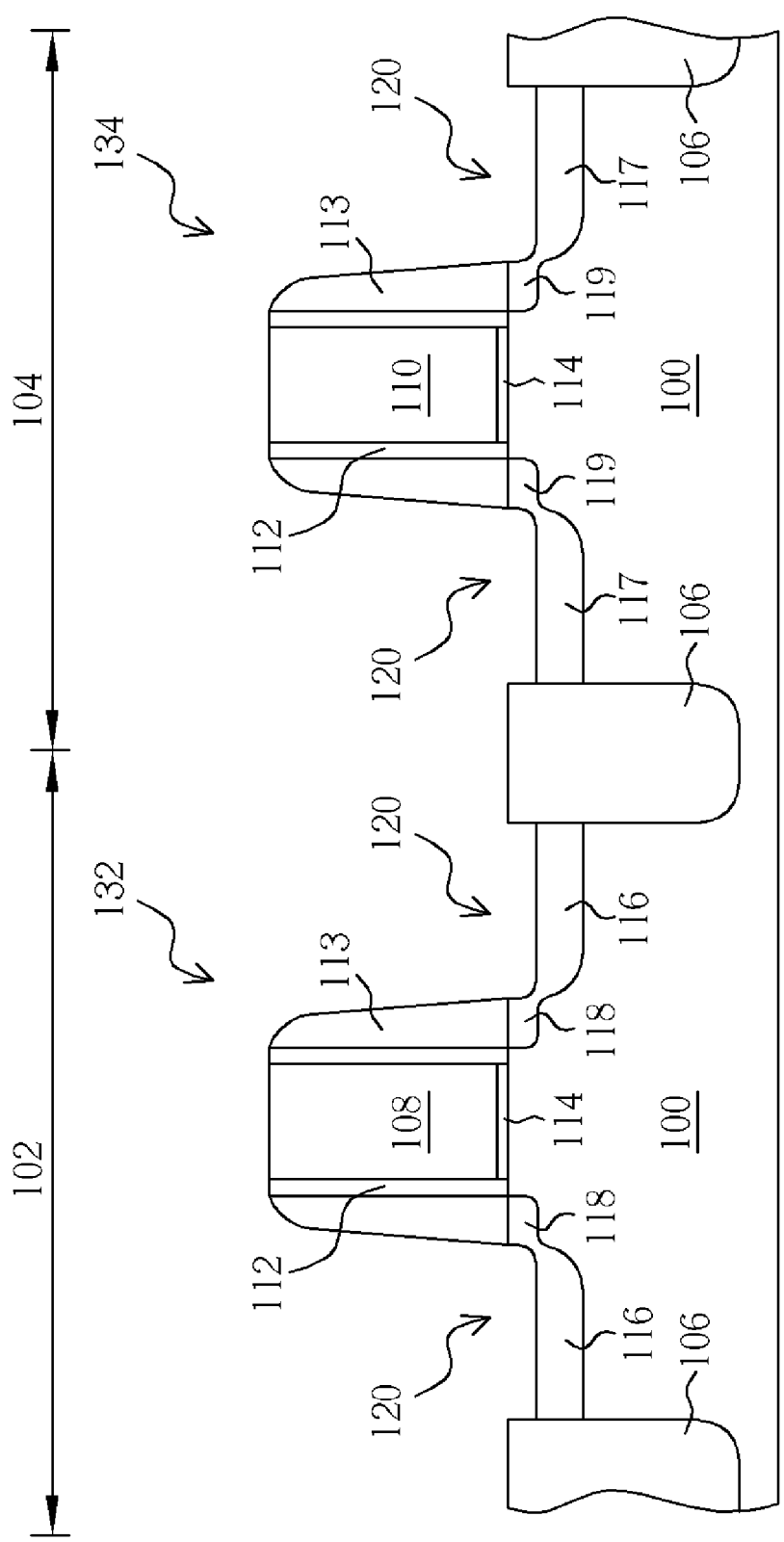
Figure 3:
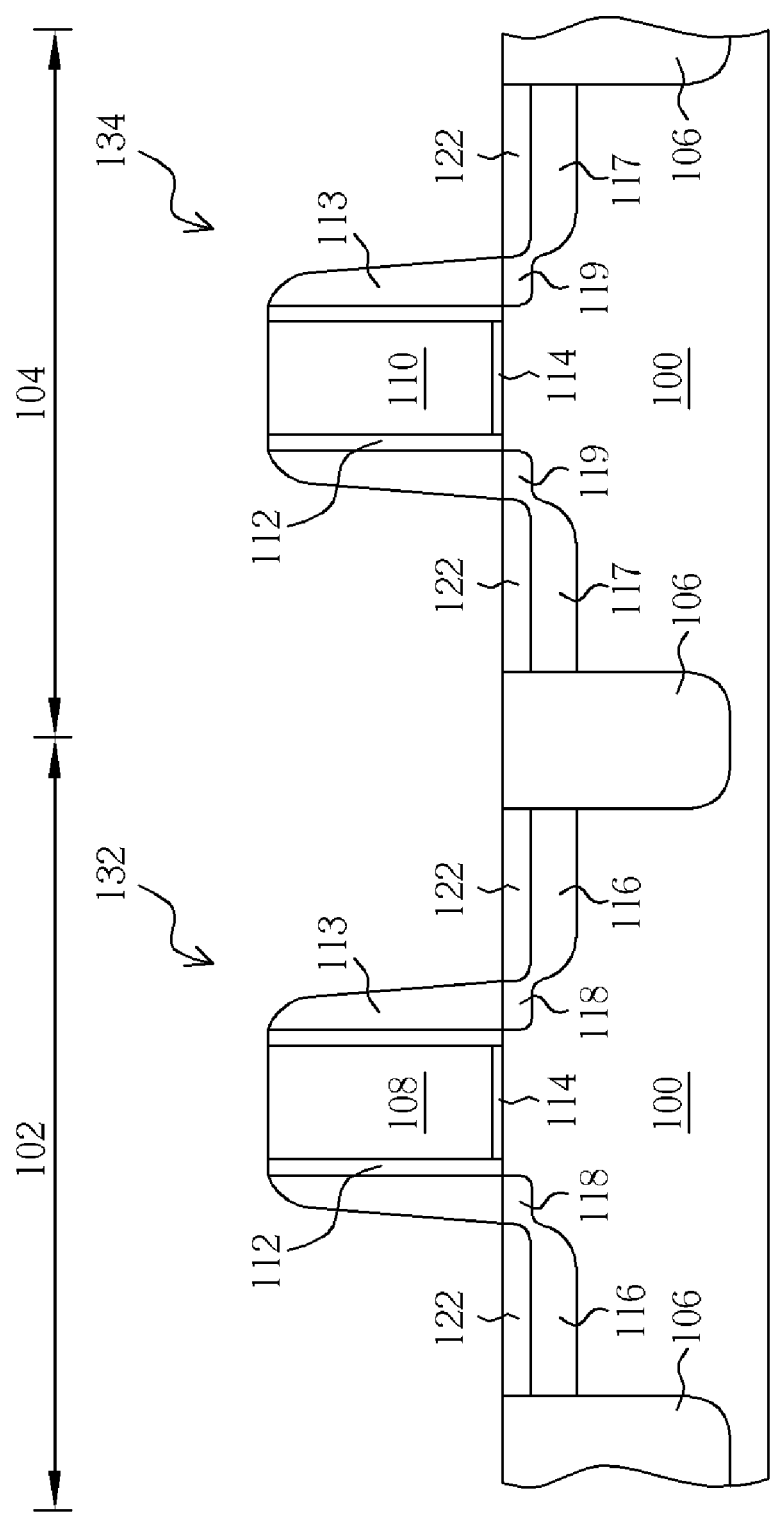
Figure 4:
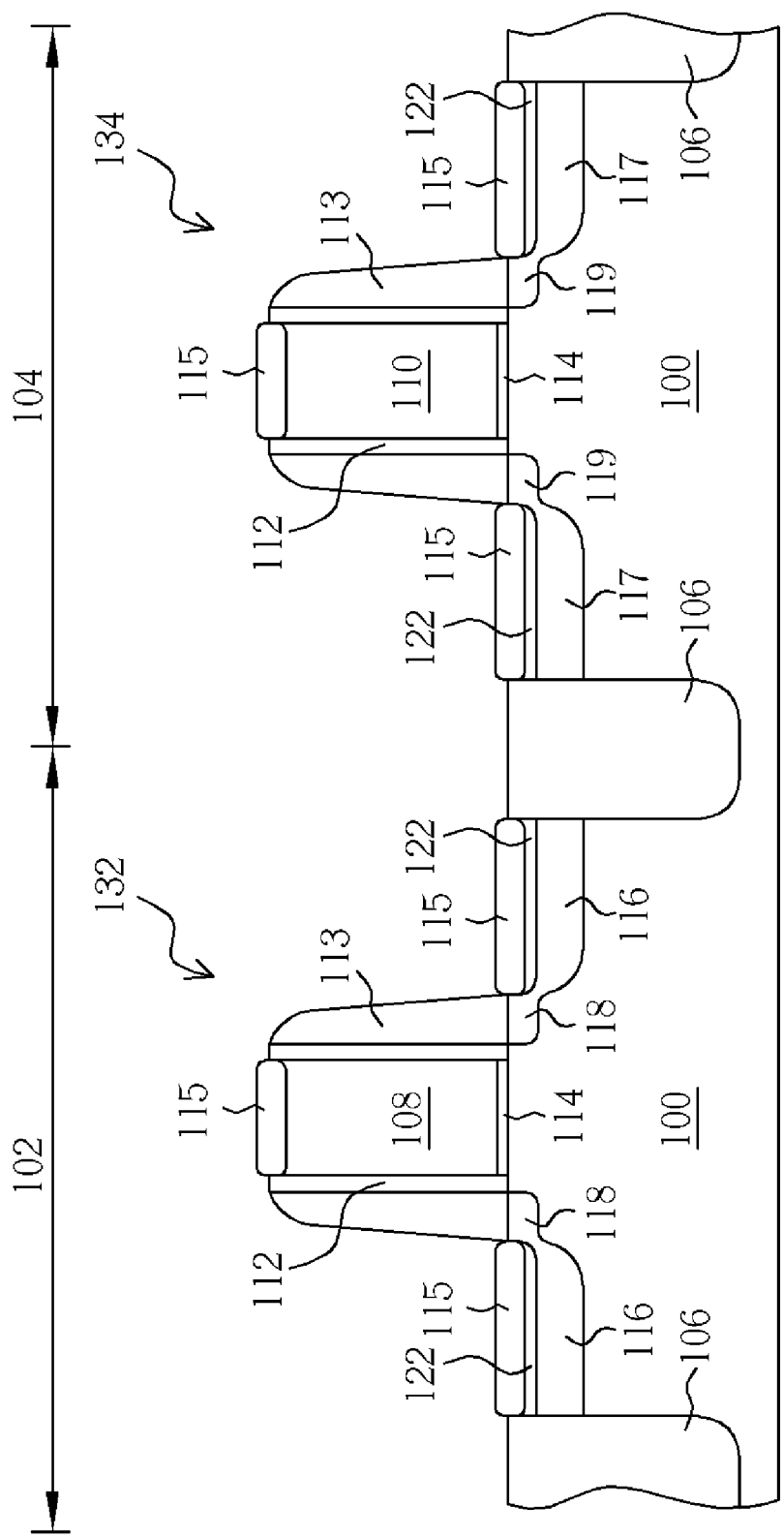
Figure 5:
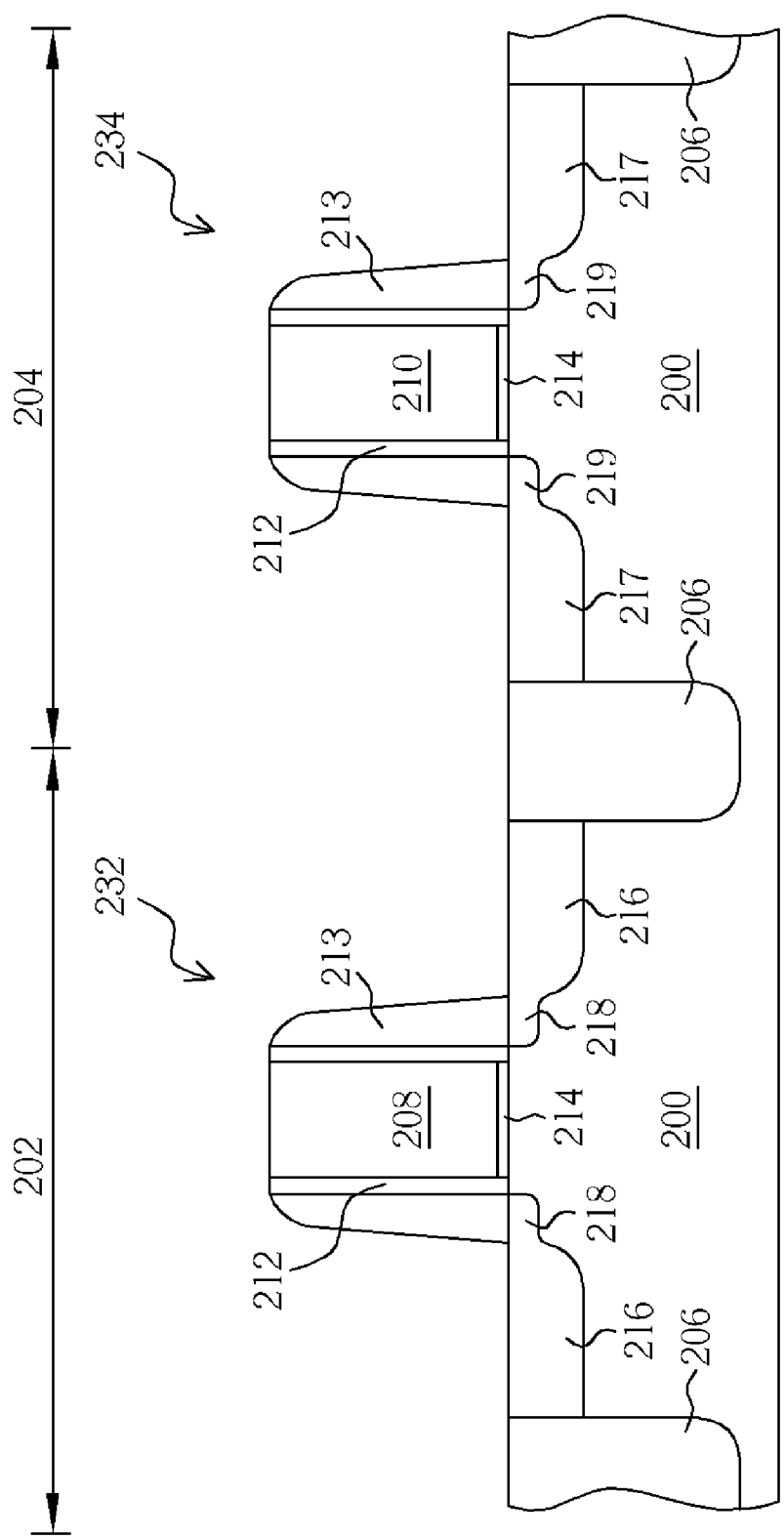
FIGS. 5-12 are perspective diagrams illustrating a method for fabricating a strained-silicon CMOS transistor according to the present invention.

Please refer to FIGS. 5-12. FIGS. 5-12 are perspective diagrams illustrating a method for fabricating a strained-silicon CMOS transistor according to the present invention. As shown in FIG. 5, a semiconductor substrate 200 having an NMOS region 202 and a PMOS region 204 is provided, in which the NMOS region 202 and the PMOS region 204 are separated by a shallow trench isolation 206. Each of the NMOS region 202 and the PMOS region 204 includes a gate structure. The NMOS gate structure includes an NMOS gate 208 and a gate dielectric 214 disposed between the NMOS gate 208 and the semiconductor substrate 200. The PMOS gate structure includes a PMOS gate 210 and a gate dielectric 214 disposed between the PMOS gate 210 and the semiconductor substrate 200. The sidewall of the NMOS gate 208 and the PMOS gate 210 includes an offset spacer 212 composed of silicon oxide or silicon nitride.

Next, an ion implantation process is performed to form a lightly doped drain 218 and 219 in the semiconductor substrate 200 surrounding the NMOS gate 208 and the PMOS gate 210, and a spacer 213 is form on the sidewall of the NMOS gate 208 and the PMOS gate 210 thereafter. Next, another ion implantation process is performed to form a source/drain region 216 around the NMOS gate 208 and a source/drain region 217 around the PMOS gate 210 within the semiconductor substrate 200. A rapid thermal annealing process is performed thereafter to use a temperature between 900° C. to 1050° C. to activate the dopants within the source/drain region 216 and 217 and repair the lattice structure of the semiconductor substrate 200 which has been damaged during the ion implantation process. An NMOS transistor 232 and a PMOS transistor 234 are thus formed in the NMOS region 202 and the PMOS region 204 respectively.

Figure 6:
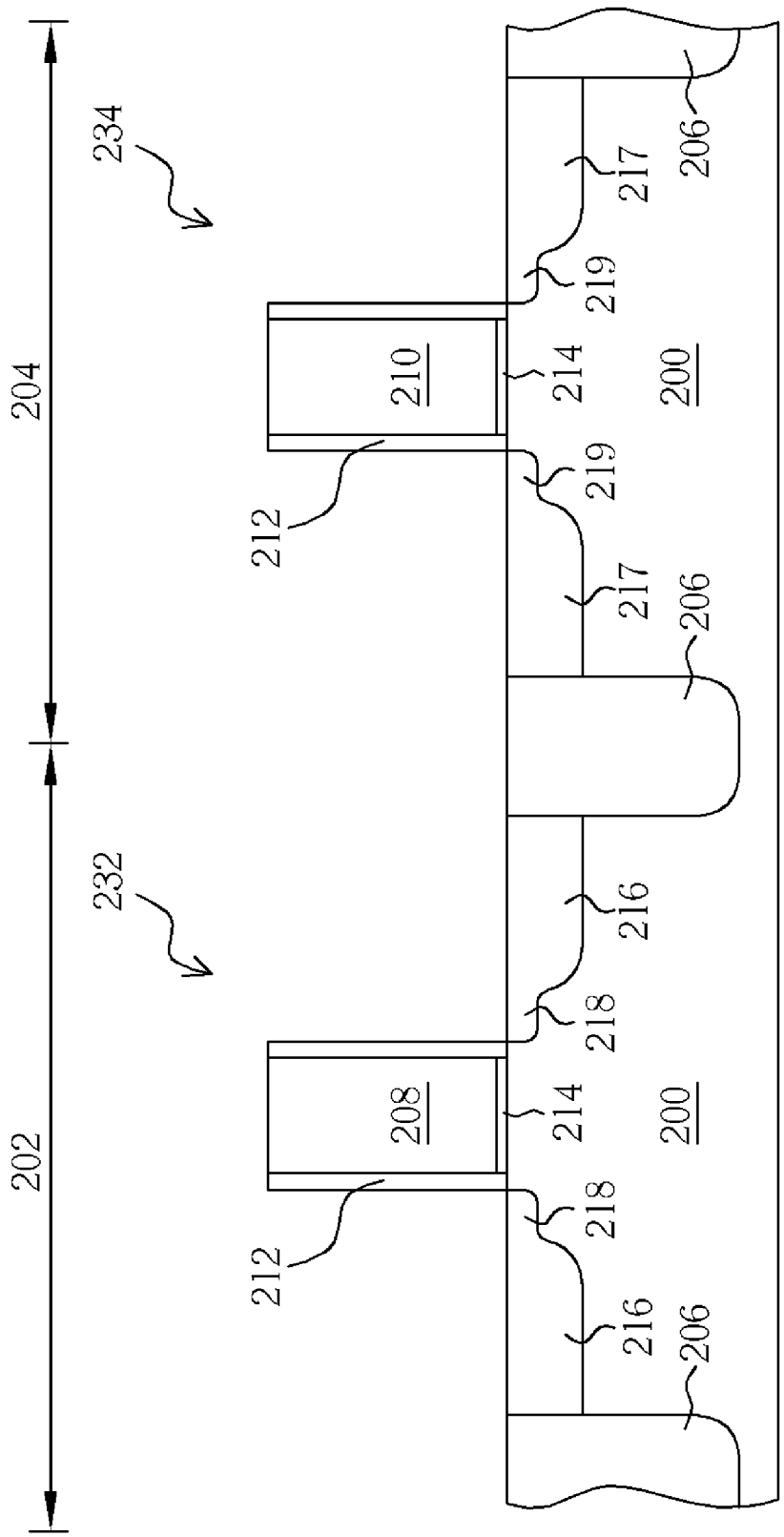

Next, as shown in FIG. 6, the spacer 213 formed on the sidewall of the NMOS gate 208 and the PMOS gate 210 is removed.

Figure 7:
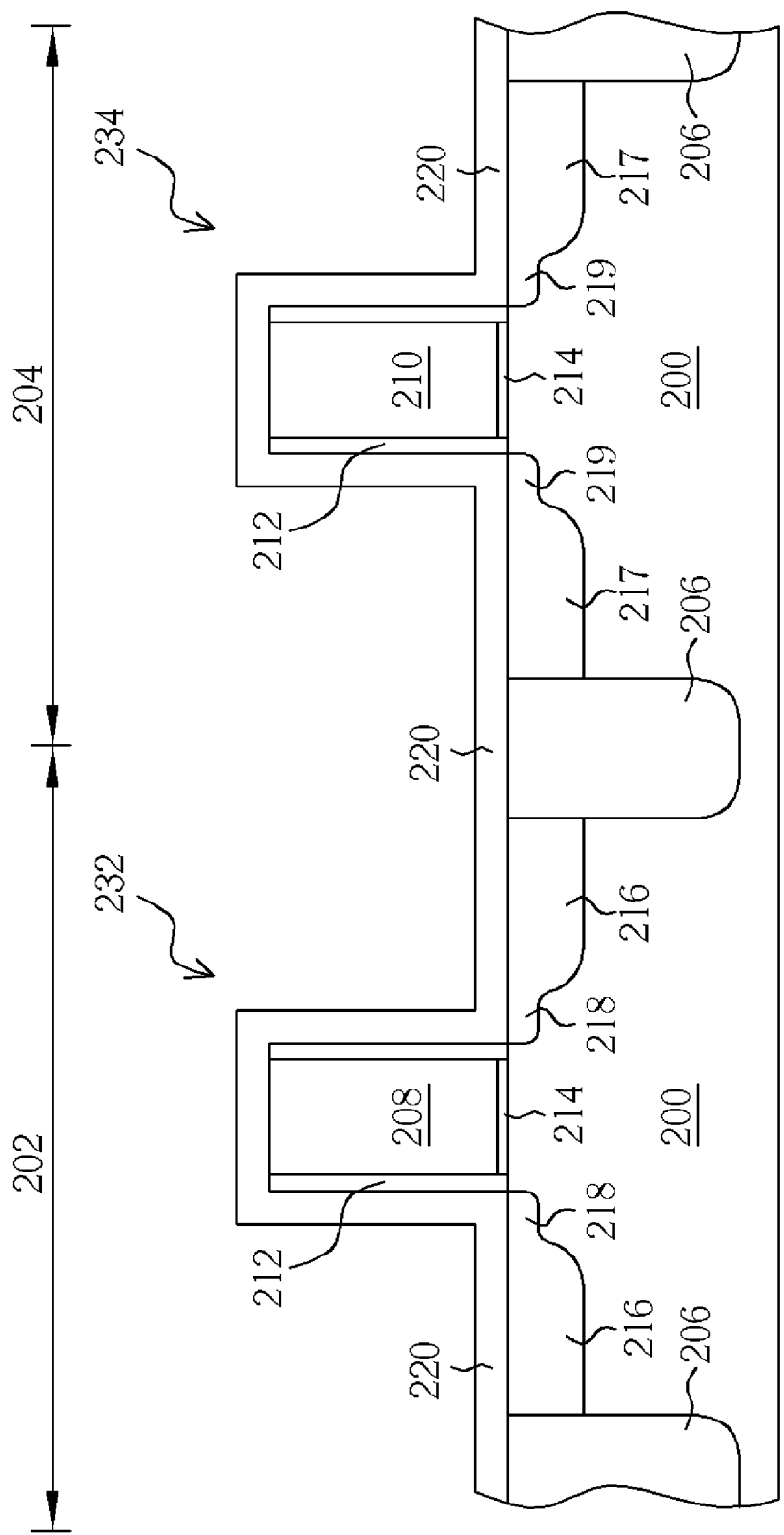

As shown in FIG. 7, a cap layer 220 is disposed on the NMOS transistor 232 and the PMOS transistor 234. According to the preferred embodiment of the present invention, the cap layer 220 is an oxide layer composed of silicon oxide or a stress layer composed of silicon nitride. For instance, the cap layer 220 can be a high tensile stress film, such that the high tensile stress film can be used to increase the electron mobility of the NMOS transistor 232.

Figure 8:
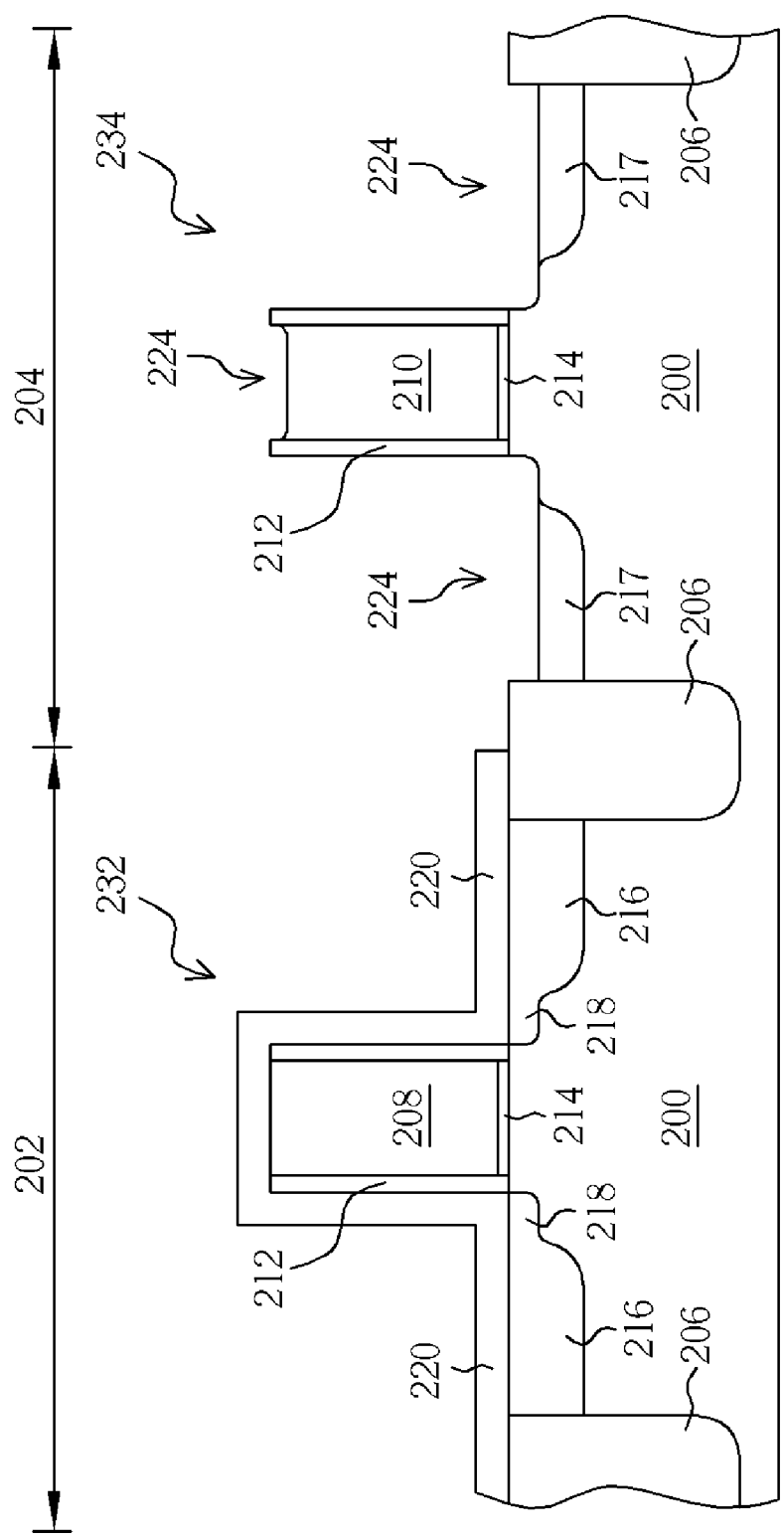

Next, as shown in FIG. 8, the cap layer 220 of the PMOS region 204 is removed, and an etching process is performed by using the cap layer 220 of the NMOS region 202 and the PMOS gate 210 as a mask to form a recess 224 on top of the PMOS gate 210 and in the source/drain region 217 of the PMOS region 204.

Figure 9:
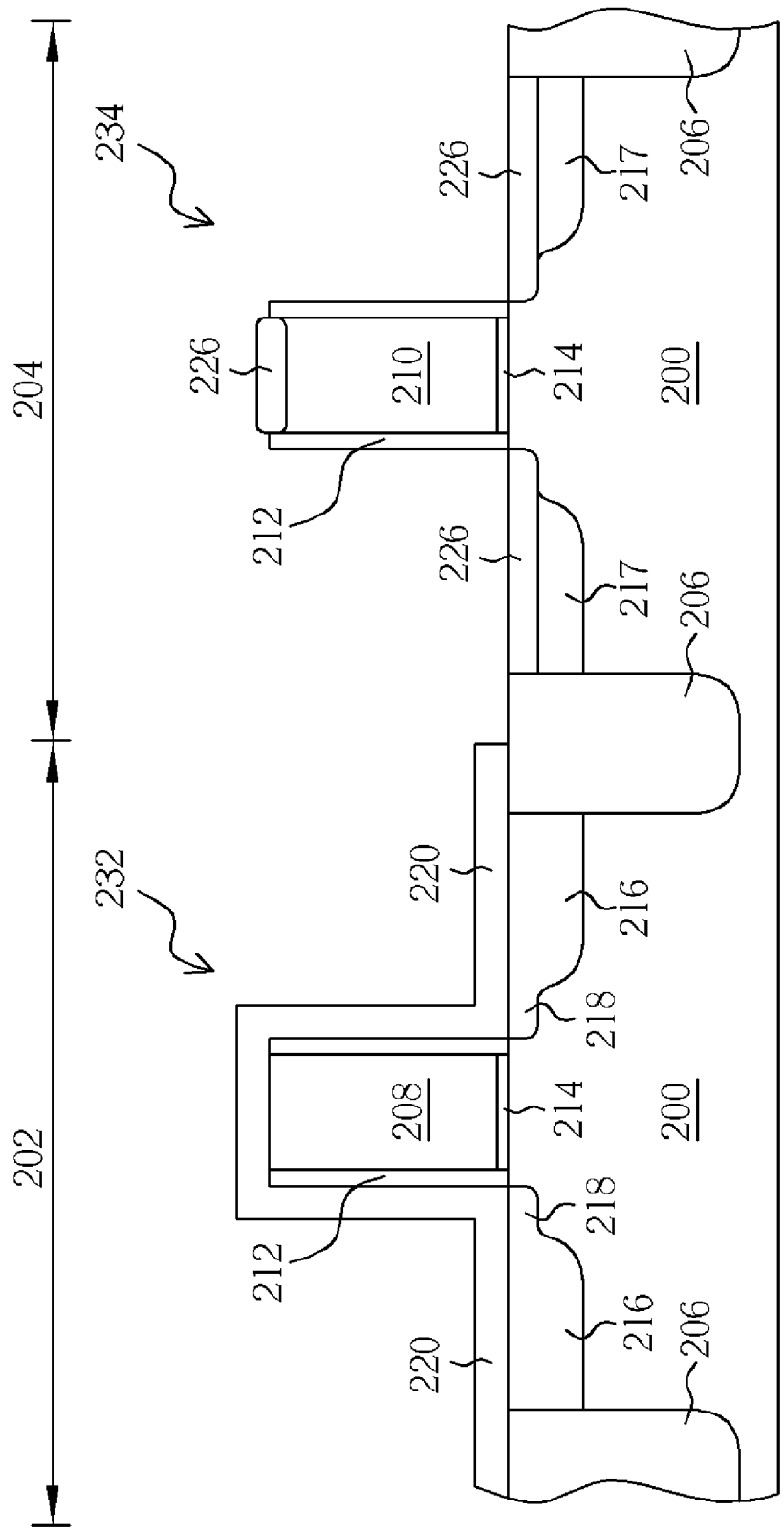

Next, as shown in FIG. 9, a cleaning process is performed to remove impurities from the recess 224, and a selective epitaxial growth process is performed to form an epitaxial layer 226 in the recess 224.

Figure 10:
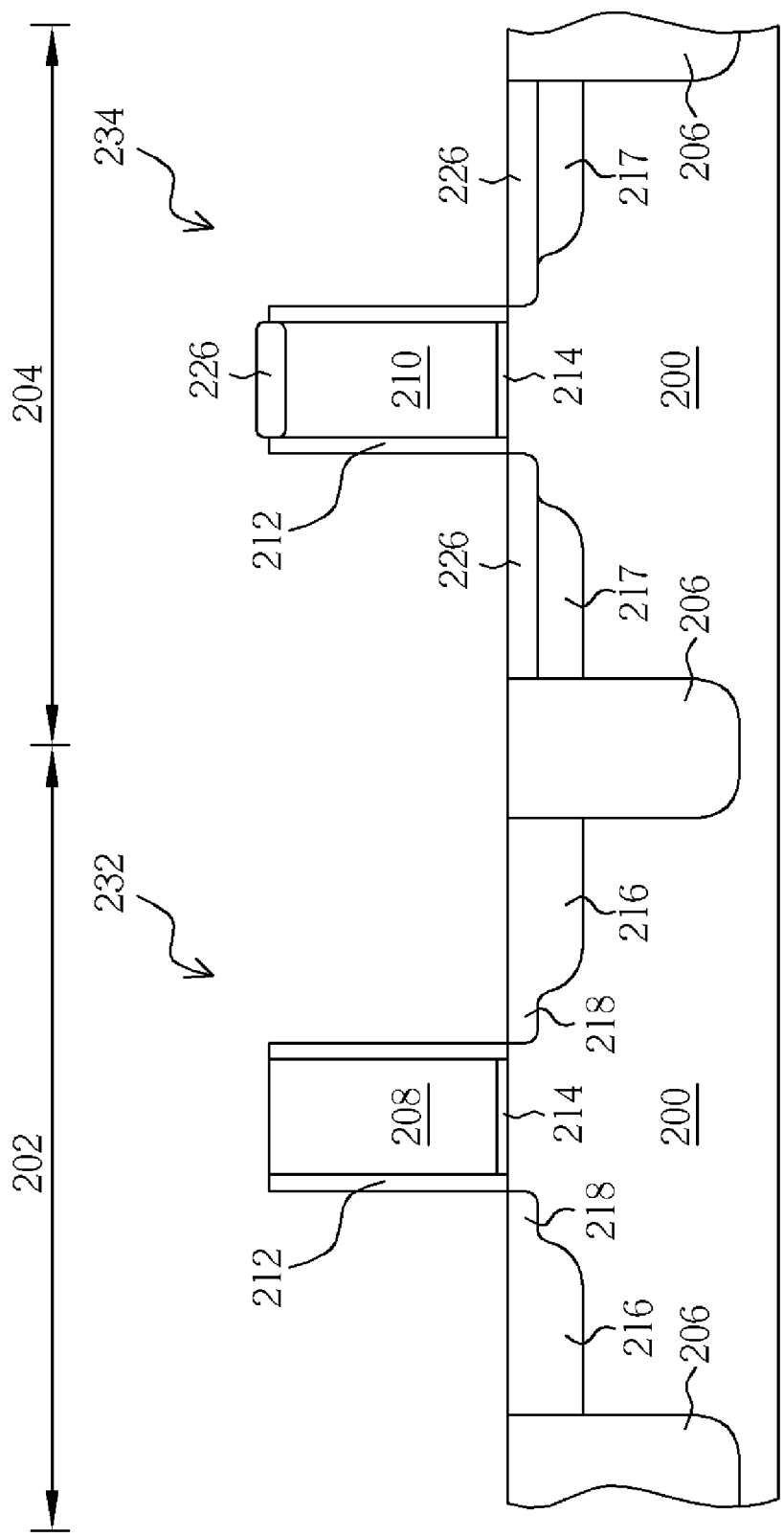

As shown in FIG. 10, the cap layer 220 is removed from the surface of the NMOS transistor 232.

Figure 11:
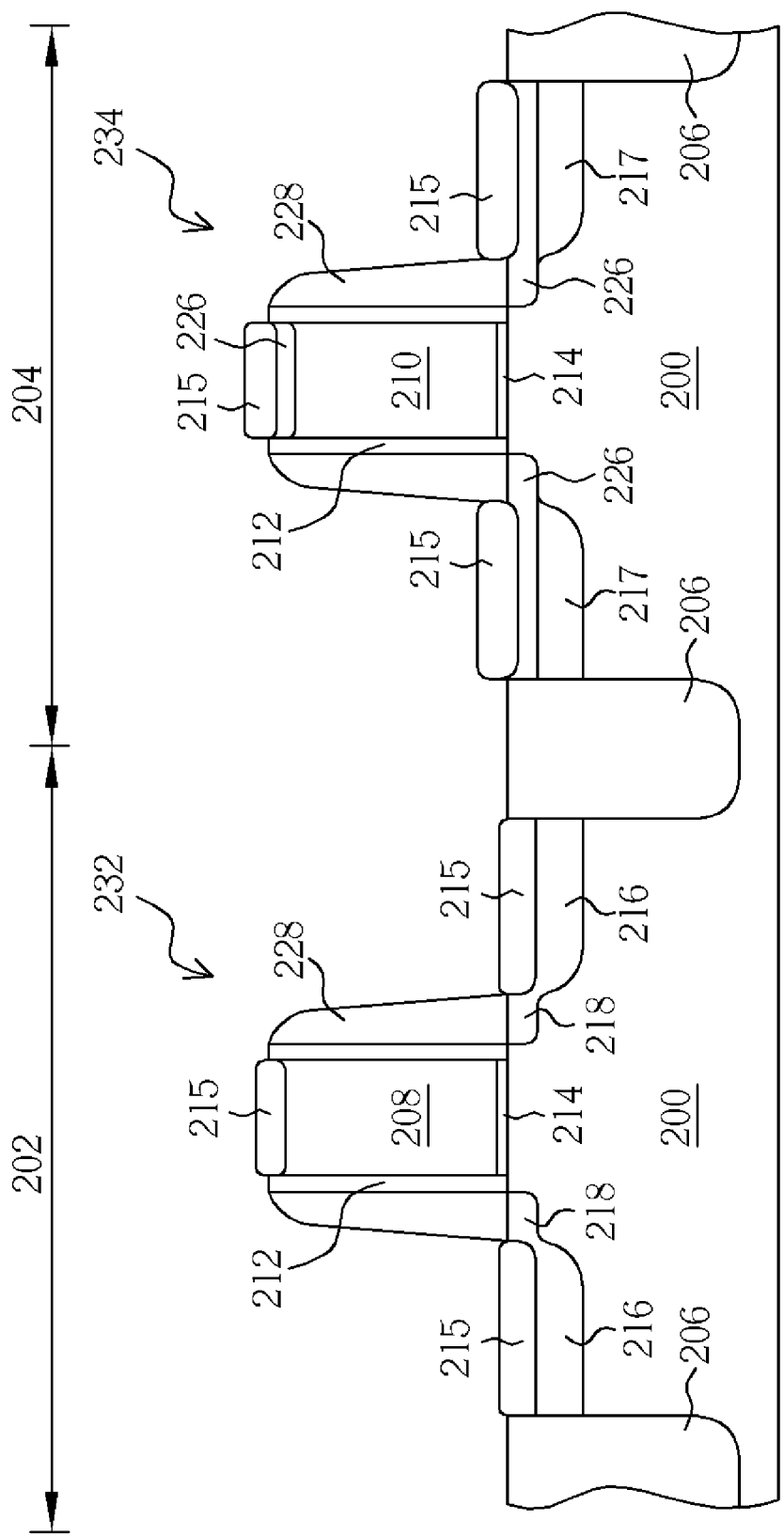

As shown in FIG. 11, a spacer 228 is formed on the sidewall of the NMOS gate 208 and the PMOS gate 210. Thereafter, a metal layer (not shown) composed of nickel, cobalt, titanium, or molybdenum is disposed on the NMOS transistor 232 and the PMOS transistor 234, and a rapid thermal annealing process is performed to react the metal layer with the NMOS gate 208, the PMOS gate 210, and the source/drain region 216 and 217 to form a plurality of salicide layers 215.

Figure 12:
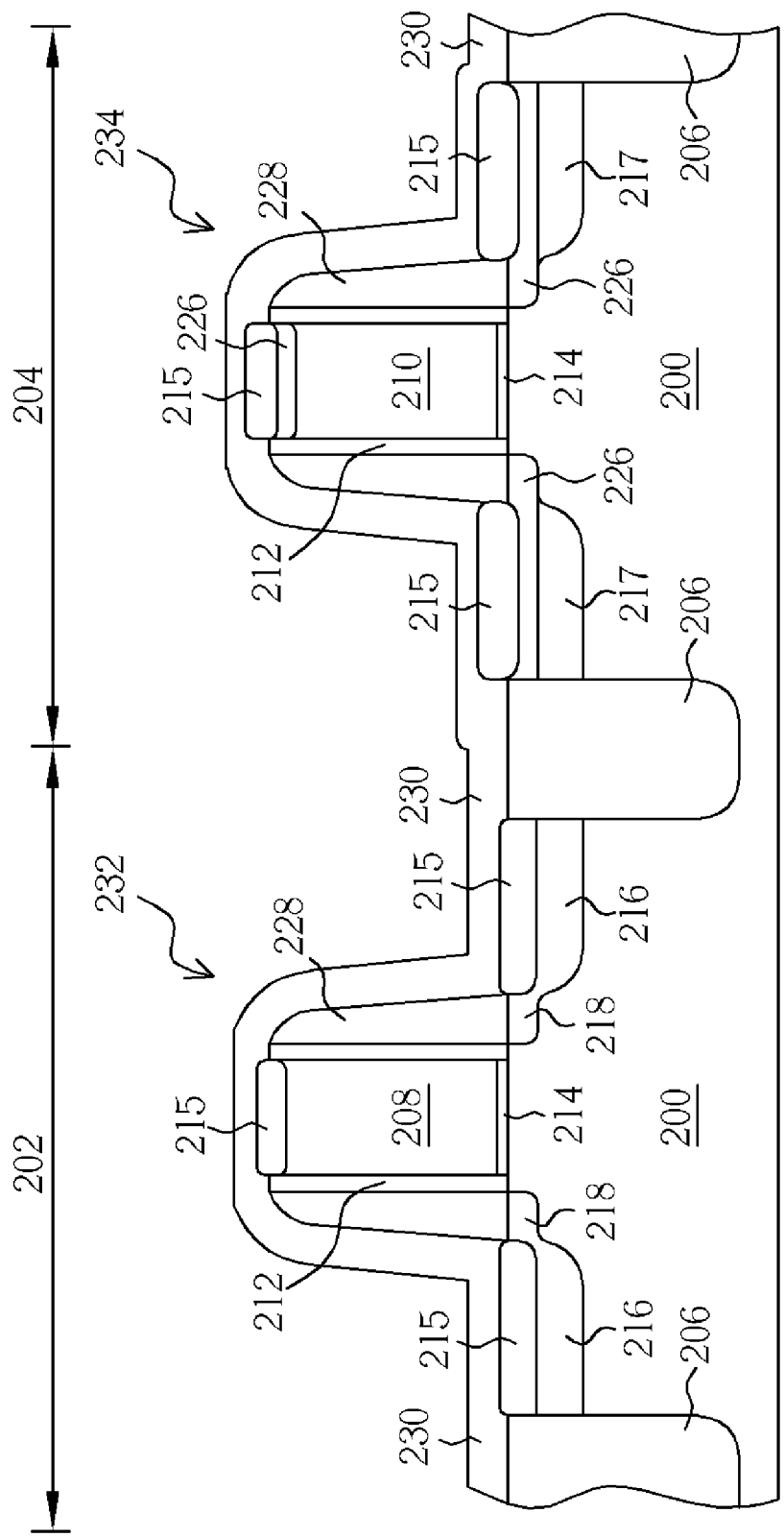

Next, as shown in FIG. 12, a film composed of silicon nitride is disposed on the NMOS transistor 232 and the PMOS transistor 234 for serving as a contact etch stop layer 230.

It should be noted that the present invention first removes the spacer from the sidewall of the gate of each transistor, as shown in FIG. 6, and deposits an epitaxial layer in the corresponding source/drain region of the PMOS region, as shown in FIG. 9. Preferably, by removing the spacer to reduce the distance between the epitaxial layer and the channel region, the hole mobility of the PMOS transistor is increased significantly. Additionally, while the epitaxial layer is formed to increase the strain of the PMOS transistor, a high tensile stress film is deposited on the NMOS transistor for increasing the electron mobility of the NMOS transistor.

According to another embodiment of the present invention, the order and timing for forming each doping region or spacer can be adjusted accordingly. For instance, without forming the spacer 213, an ion implantation process can be conducted directly after the formation of the NMOS gate 208, the PMOS gate 210, and the offset spacer 212 to form the source/drain regions 216 and 217 of the NMOS transistor 232 and the PMOS transistor 234. Additionally, the lightly doped drain 219 of the PMOS region 204 can be formed after the formation of the offset spacer 212, and the lightly doped drain 218 of the NMOS region 202 can be formed after the removal of the cap layer 220. Moreover, the source/drain region 216 and 217 of the NMOS transistor 232 and the PMOS transistor 234 can be formed after the formation of the second spacer 228. Preferably, these steps can be performed interchangeably, such as being conducted altogether within a single process or being performed separately in different processes, which are all within the scope of the present invention.

Figure 13:
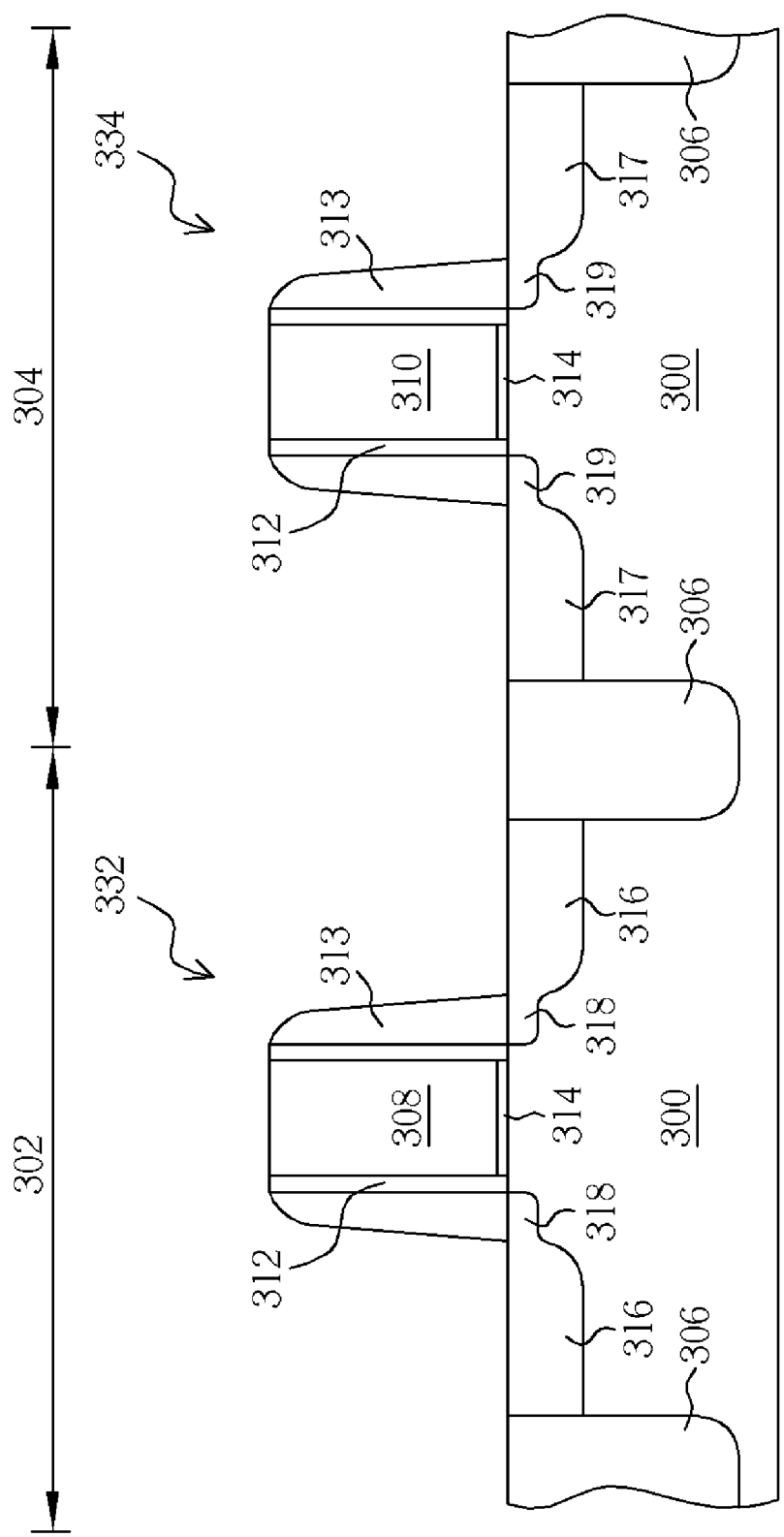
FIGS. 13-20 are perspective diagrams illustrating a method for fabricating a strained-silicon CMOS transistor according to an embodiment of the present invention.

Please refer to FIGS. 13-20. FIGS. 13-20 are perspective diagrams illustrating a method for fabricating a strained-silicon CMOS transistor according to an embodiment of the present invention. As shown in FIG. 13, a semiconductor substrate 300 having an NMOS region 302 and a PMOS region 304 is provided, in which the NMOS region 302 and the PMOS region 304 are separated by a shallow trench isolation 306. Each of the NMOS region 302 and the PMOS region 304 includes a gate structure. The NMOS gate structure includes an NMOS gate 308 and a gate dielectric 314 disposed between the NMOS gate 308 and the semiconductor substrate 300. The PMOS gate structure includes a PMOS gate 310 and a gate dielectric 314 disposed between the PMOS gate 310 and the semiconductor substrate 300. The sidewall of the NMOS gate 308 and the PMOS gate 310 includes an offset spacer 312 composed of silicon oxide or silicon nitride.

Next, an ion implantation process is performed to form a lightly doped drain 318 and 319 in the semiconductor substrate 300 surrounding the NMOS gate 308 and the PMOS gate 310, and a spacer 313 is form on the sidewall of the NMOS gate 308 and the PMOS gate 310 thereafter. Next, another ion implantation process is performed to form a source/drain region 316 around the NMOS gate 308 and a source/drain region 317 around the PMOS gate 310 within the semiconductor substrate 300. A rapid thermal annealing process is performed thereafter to use a temperature between 900° C. to 1050° C. to activate the dopants within the source/drain region 316 and 317 and repair the lattice structure of the semiconductor substrate 300 which has been damaged during the ion implantation process. Thus, an NMOS transistor 332 and a PMOS transistor 334 are formed in the NMOS region 302 and the PMOS region 304 respectively.

Figure 14:
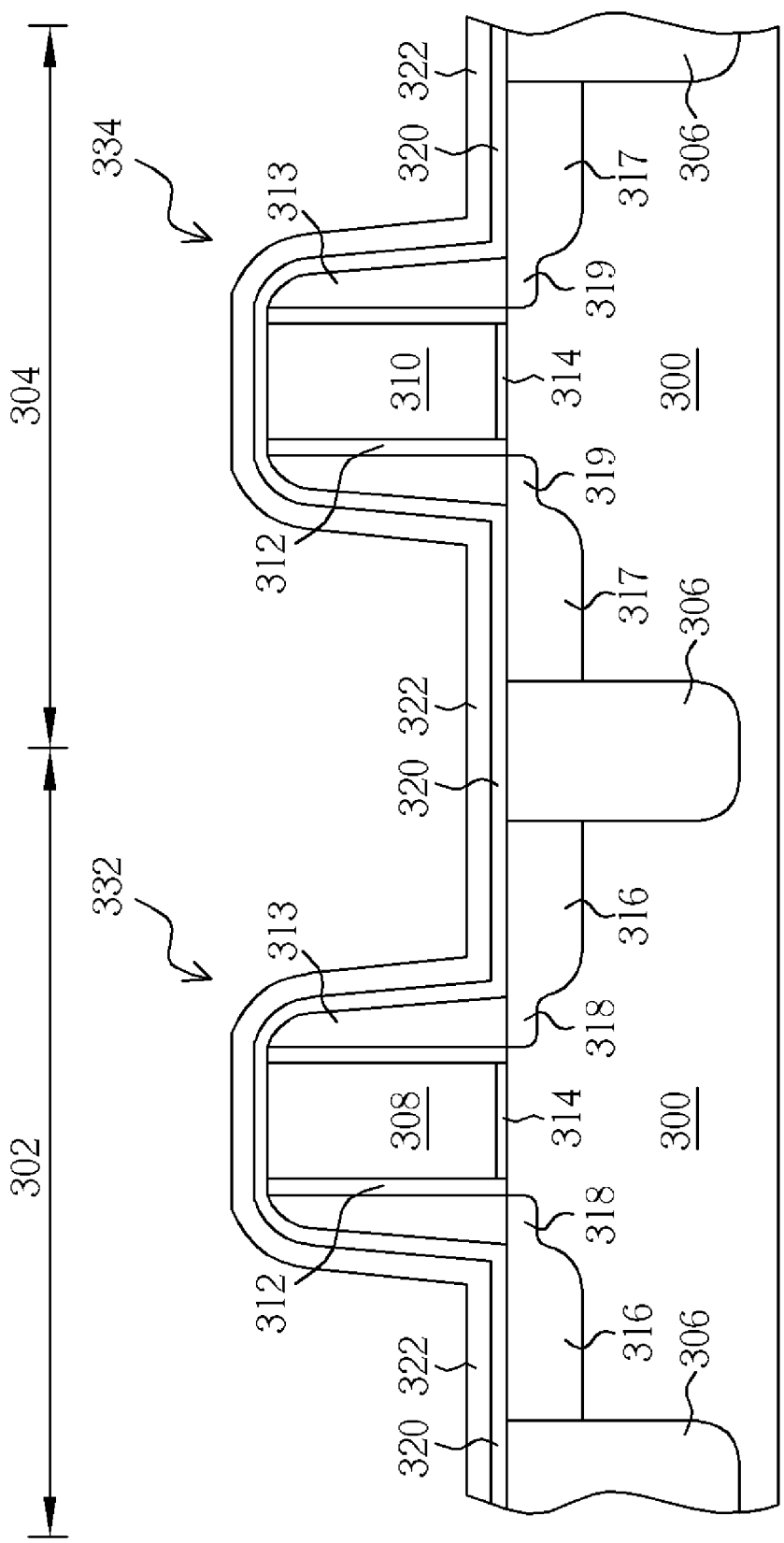

Next, as shown in FIG. 14, a buffer layer 320 and a stress layer 322 are deposited on the NMOS transistor 332 and the PMOS transistor 334. According to the preferred embodiment of the present invention, the buffer layer 320 is composed of silicon oxide and the stress layer 322 is composed of silicon nitride. Additionally, the stress layer 322 can be a high tensile stress film, such that the high tensile stress film can be used to increase the electron mobility of the NMOS transistor 332.

Figure 15:
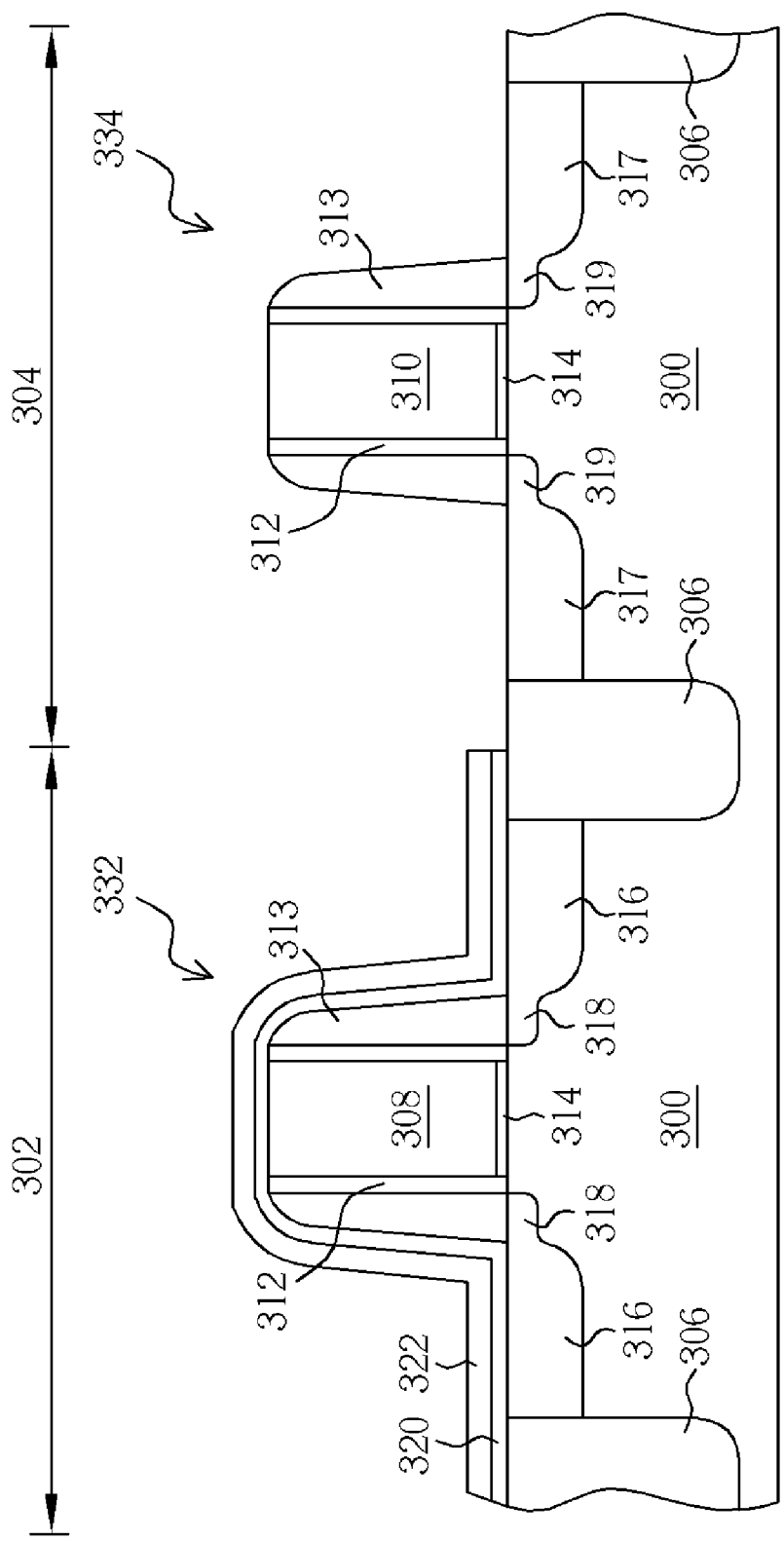

As shown in FIG. 15, an etching process is performed by using a patterned photoresist (not shown) as a mask to remove the buffer layer 320 and the stress layer 322 disposed in the PMOS region 304. Subsequently, a rapid thermal annealing process is performed to increase the tensile stress of the NMOS transistor.

Figure 16:
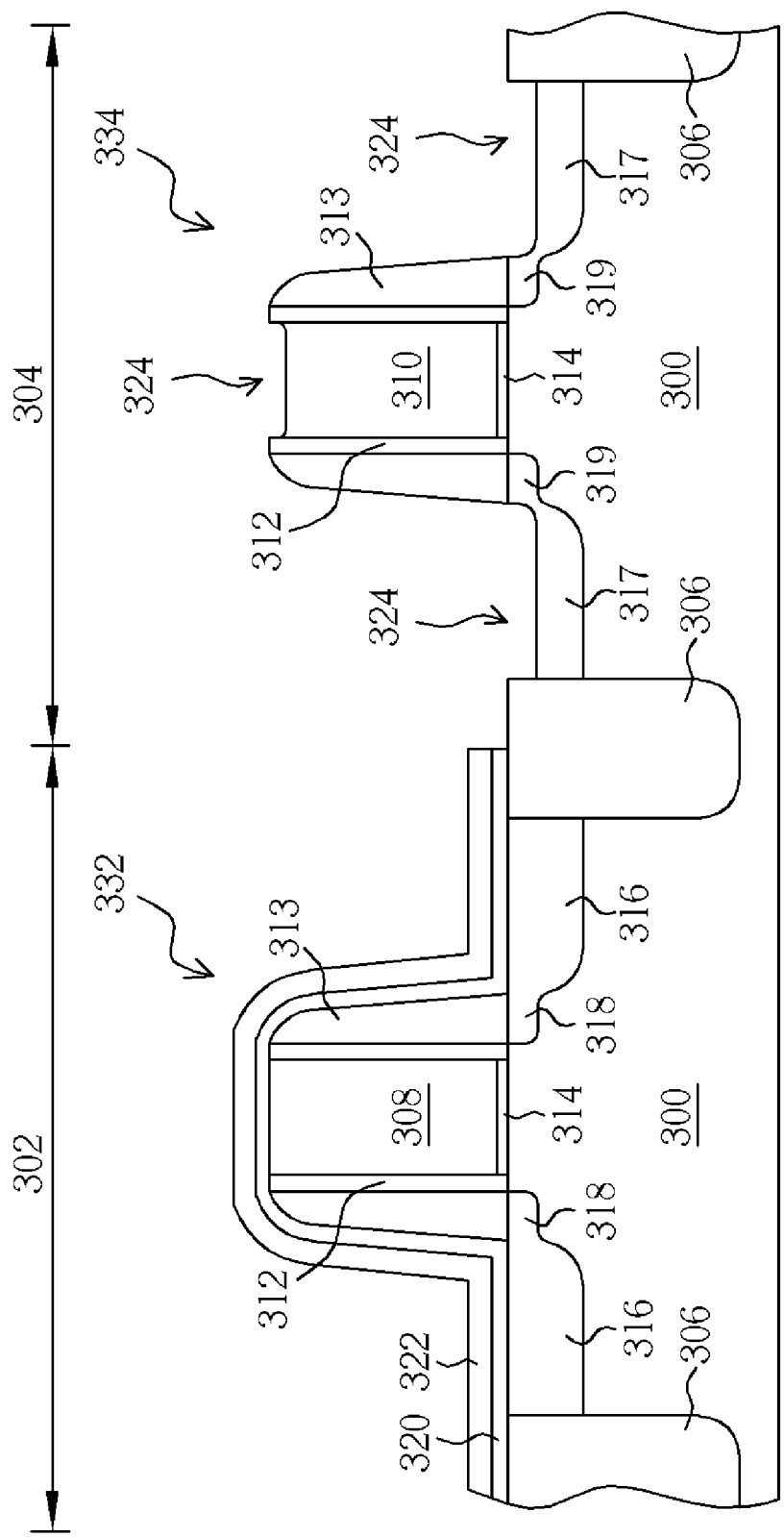

As shown in FIG. 16, another etching process is performed by using the remaining stress layer 322 of the NMOS region 302 and the PMOS gate 310 as a mask to form a recess 324 on top of the PMOS gate 310 and in the source/drain region 317 of the PMOS region 304.

Figure 17:
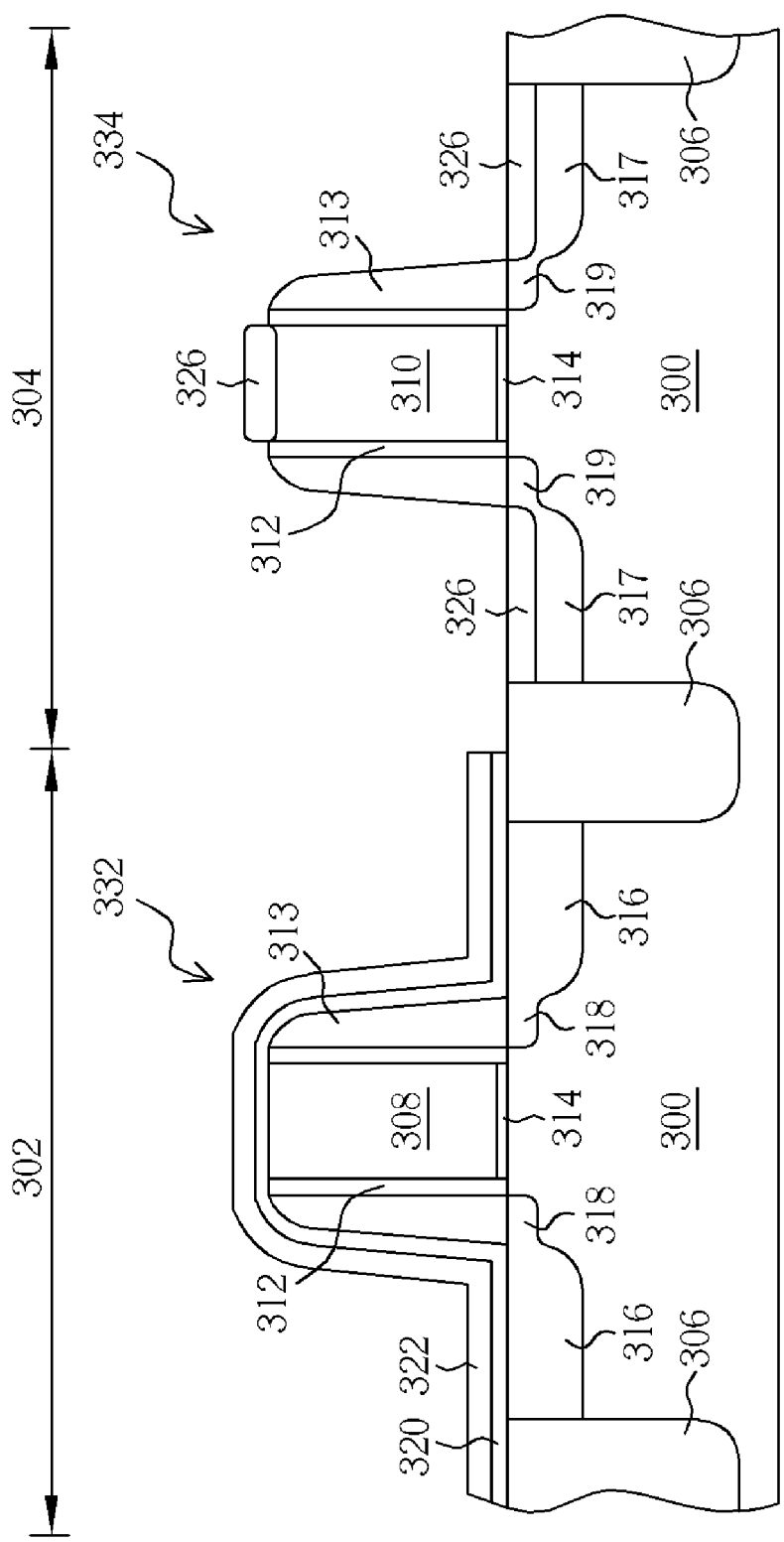

Next, as shown in FIG. 17, a cleaning process is performed to remove the impurities from the surface of the recess 324 and a selective epitaxial growth is performed to form an epitaxial layer 326 in the recess 324.

Figure 18:
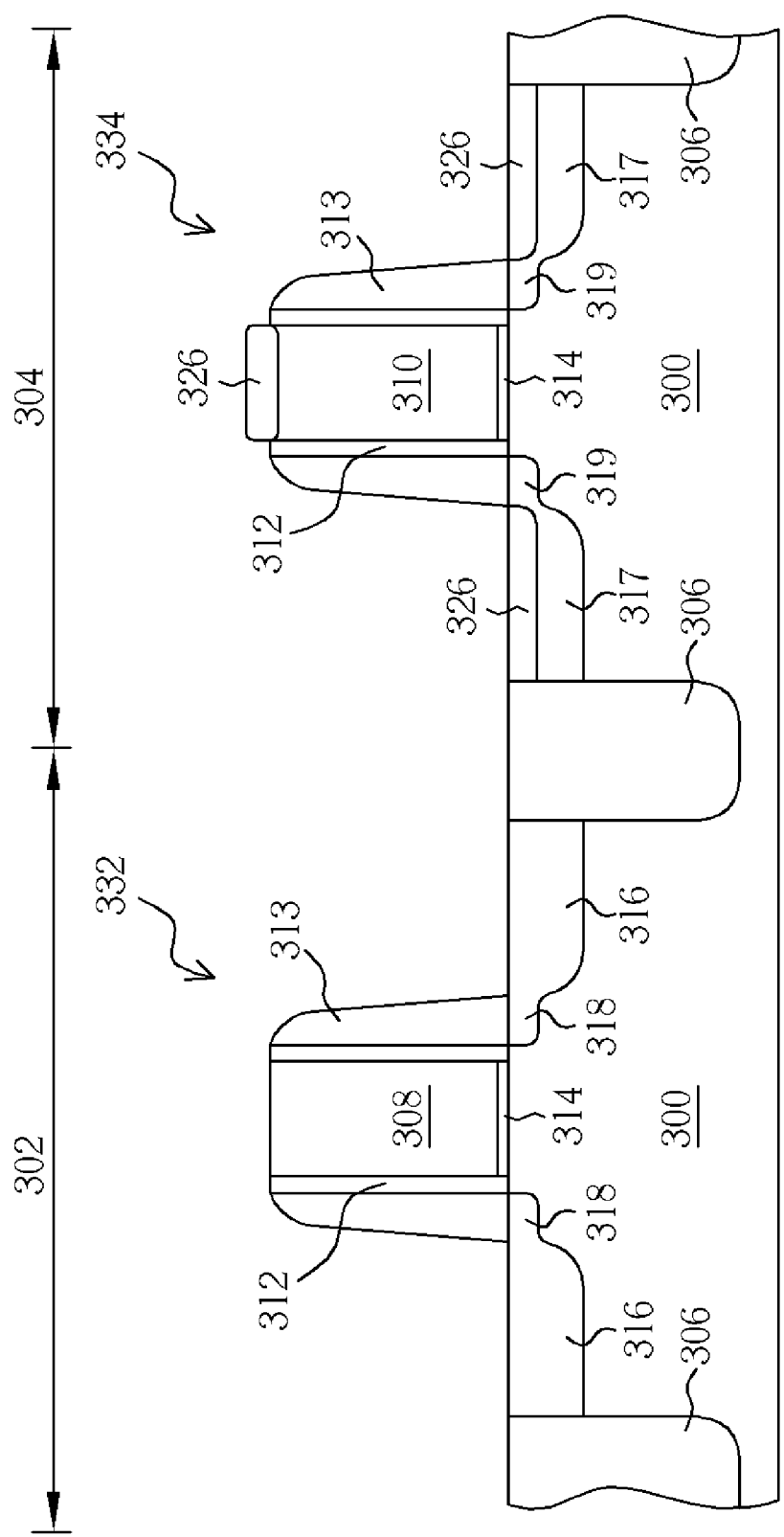
Figure 19:
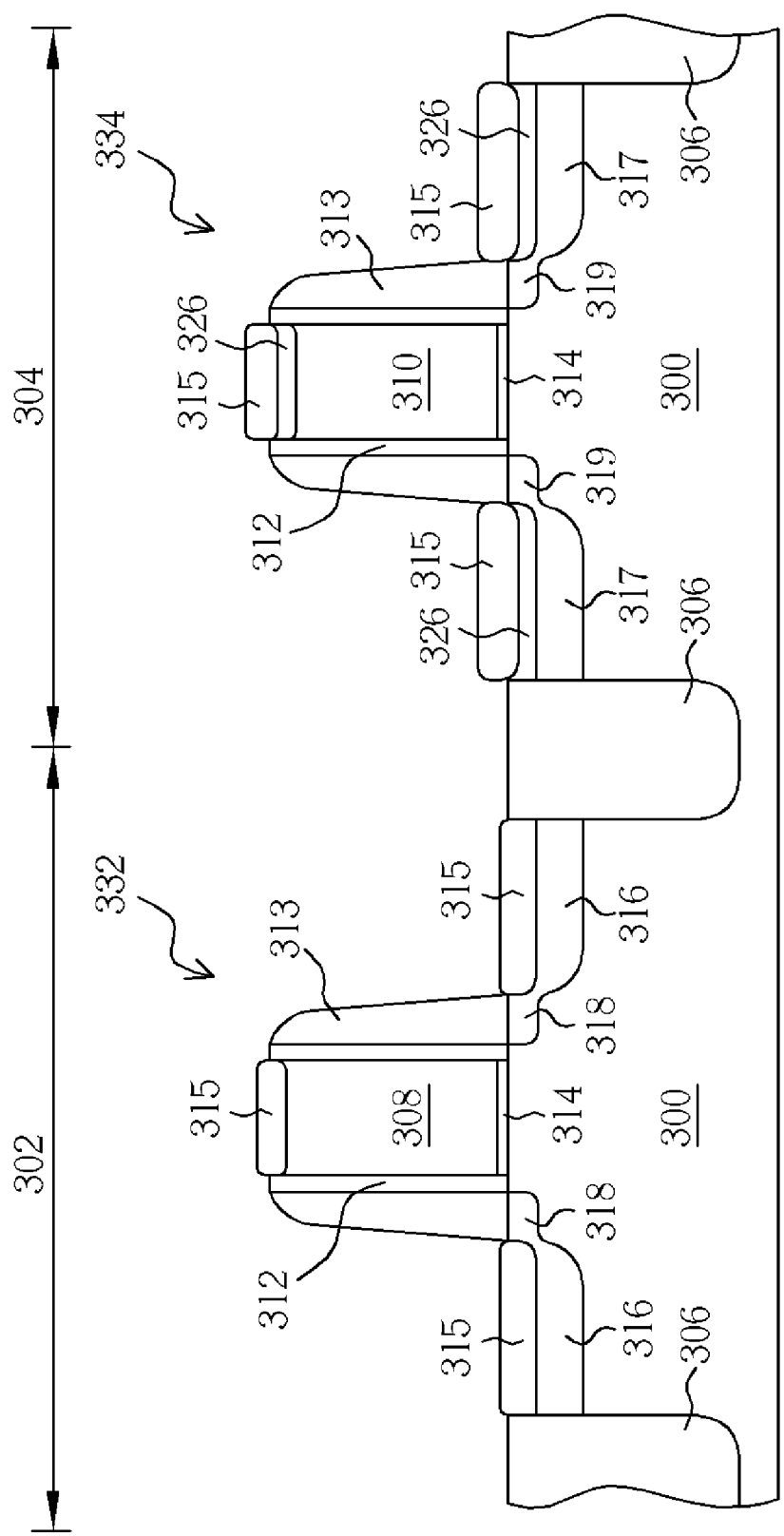

As shown in FIG. 18, the buffer layer 320 and the stress layer 322 are removed from the NMOS region 302. Thereafter, a salicide block (not shown) can be formed on a portion of the semiconductor substrate 300, and a salicide layer 315 can be formed on the NMOS transistor 332 and PMOS transistor 334 not covered by the salicide block, as shown in FIG. 19. According to an embodiment of the present invention, the salicide block can be made of the buffer layer 320 and the stress layer 322 described previously.

Figure 20:
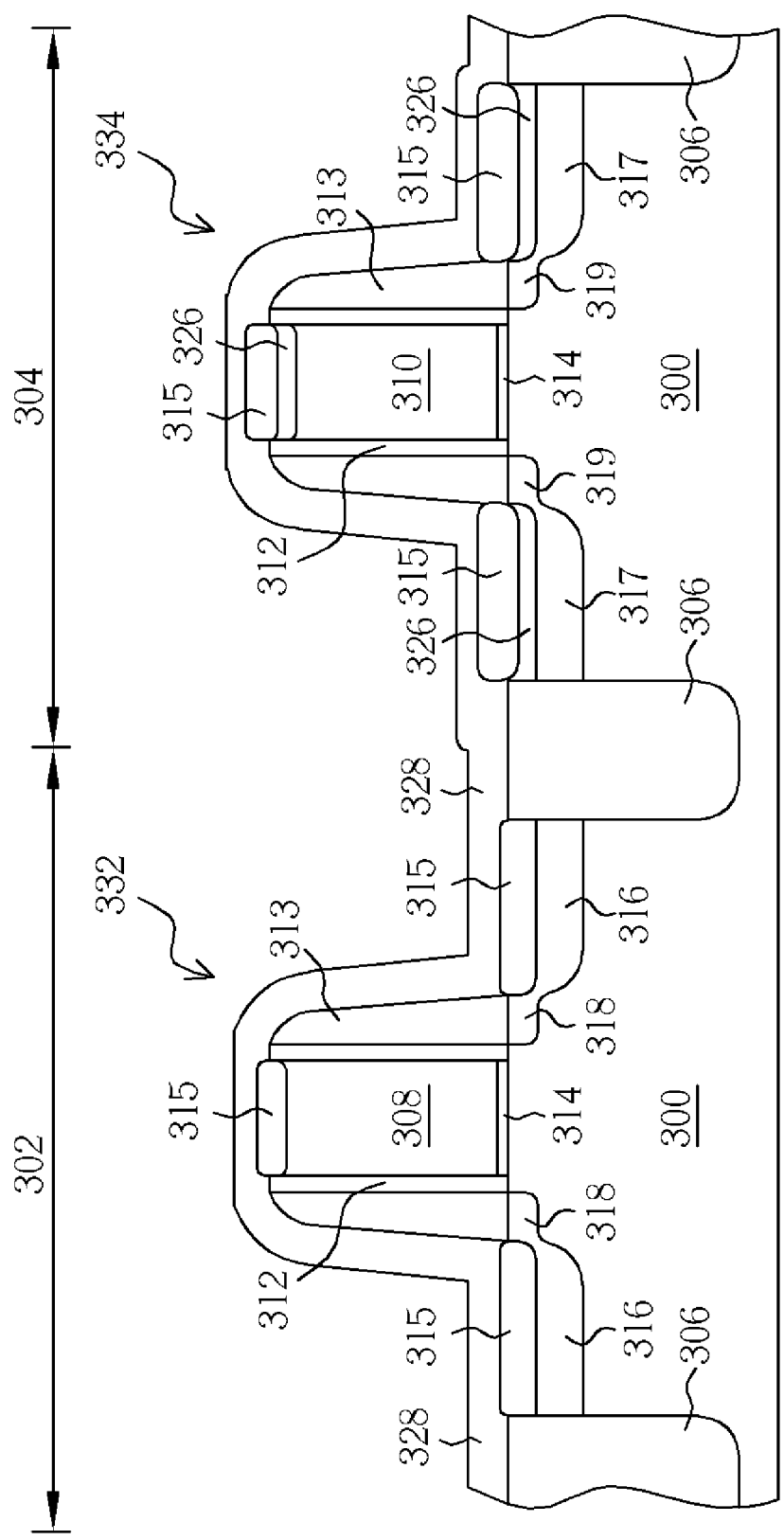

Similar to the previous embodiment, the formation of the salicide layer 315 can be accomplished by first depositing a metal layer (not shown) composed of nickel, cobalt, titanium, or molybdenum on the NMOS transistor 332 and the PMOS transistor 334, and a rapid thermal annealing process is performed to react the metal layer with the NMOS gate 308, the PMOS gate 310, and the source/drain region 316 and 317 to form a plurality of salicide layers 315. Subsequently, another stress layer can be deposited on the NMOS transistor 332 and the PMOS transistor 334 for serving as a contact etch stop layer 328, as shown in FIG. 20, which is also within the scope of the present invention.

Specifically, the present invention discloses a method for fabricating a strained-silicon CMOS transistor, in which a stress layer and an epitaxial layer are both utilized to increase the performance of the NMOS transistor and the PMOS transistor. As described in the aforementioned embodiments, a stress layer can be first deposited on the NMOS transistor and the PMOS transistor, and after removing the stress layer from the PMOS transistor, a recess is formed in the corresponding source/drain region of the PMOS transistor. Subsequently, an epitaxial layer is formed in the recess, such that while the stress layer is used to facilitate the electron mobility of the NMOS transistor, the epitaxial layer is used to enhance the hole mobility of the PMOS transistor. According to another aspect of the present invention, the spacer can also be removed from the gate structure of each transistor prior to the formation of the stress layer. By utilizing this approach, the stress layer and the epitaxial layer can be formed much closer to the channel region of each transistor, thereby further increasing the stress being applied on each transistor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a strained-silicon CMOS transistor, comprising:
   providing a semiconductor substrate having a first active region for fabricating a first transistor, a second active region for fabricating a second transistor, and an isolation structure disposed between the first active region and the second active region;
   forming a first gate structure on the first active region and a second gate structure on the second active region;
   forming a first spacer around the first gate structure and the second gate structure;
   forming a source/drain region for the first transistor and a source/drain region for the second transistor;
   removing the first spacer from the first gate structure and the second gate structure;
   depositing a cap layer on the first transistor and the second transistor;
   removing the cap layer disposed on the second transistor;
   performing an etching process for forming a recess on the second gate structure and in the semiconductor substrate surrounding the second gate structure;
   performing a selective epitaxial growth process for forming an epitaxial layer in the recess; and
   removing the cap layer from the surface of the first transistor.

2. The method for fabricating a strained-silicon CMOS transistor of claim 1, wherein the first gate structure comprises:
   a first gate dielectric; and
   a first gate, disposed on the first gate dielectric.

3. The method for fabricating a strained-silicon CMOS transistor of claim 1, wherein the second gate structure comprises:
   a second gate dielectric; and
   a second gate, disposed on the second gate dielectric.

4. The method for fabricating a strained-silicon CMOS transistor of claim 1, wherein the first transistor comprises an NMOS transistor and the second transistor comprises a PMOS transistor.

5. The method for fabricating a strained-silicon CMOS transistor of claim 1, wherein the cap layer is a silicon oxide cap layer.

6. The method for fabricating a strained-silicon CMOS transistor of claim 1, wherein the cap layer is a stress layer.

7. The method for fabricating a strained-silicon CMOS transistor of claim 6, wherein the stress layer is a silicon nitride stress layer.

8. The method for fabricating a strained-silicon CMOS transistor of claim 6, wherein the stress layer is a high tensile stress film.

9. The method for fabricating a strained-silicon CMOS transistor of claim 1 further comprising:
   forming a second spacer around the first gate structure and the second gate structure after removing the cap layer from the surface of the first transistor;
   disposing a metal layer on the first transistor and the second transistor;
   performing a rapid thermal annealing process for forming a salicide layer on the first transistor and the second transistor; and
   removing the un-reacted metal layer.

10. The method for fabricating a strained-silicon CMOS transistor of claim 9 further comprising forming a contact etch stop layer on the first transistor and the second transistor after forming the salicide layer.

11. The method for fabricating a strained-silicon CMOS transistor of claim 1, wherein the epitaxial layer comprises silicon germanium.

12. A method for fabricating a strained-silicon CMOS transistor, comprising:
   providing a semiconductor substrate having a first active region for fabricating a first transistor, a second active region for fabricating a second transistor, and an isolation structure disposed between the first active region and the second active region;
   forming a first gate structure on the first active region and a second gate structure on the second active region;
   forming a spacer around the first gate structure and the second gate structure;
   forming a source/drain region for the first transistor and a source/drain region for the second transistor;
   depositing a buffer layer and a stress layer on the first transistor and the second transistor;
   removing the buffer layer and the stress layer from the second transistor;
   performing an etching process for forming a recess on the second gate structure and in the semiconductor substrate surrounding the second gate structure;
   performing a selective epitaxial growth process for forming an epitaxial layer in the recess; and
   removing the buffer layer and the stress layer from the surface of the first transistor.

13. The method for fabricating a strained-silicon CMOS transistor of claim 12, wherein the first gate structure comprises:
   a first gate dielectric; and
   a first gate, disposed on the first gate dielectric.

14. The method for fabricating a strained-silicon CMOS transistor of claim 12, wherein the second gate structure comprises:
   a second gate dielectric; and
   a second gate, disposed on the second gate dielectric.

15. The method for fabricating a strained-silicon CMOS transistor of claim 12, wherein the first transistor comprises an NMOS transistor and the second transistor comprises a PMOS transistor.

16. The method for fabricating a strained-silicon CMOS transistor of claim 12, wherein the buffer layer is a silicon oxide buffer layer.

17. The method for fabricating a strained-silicon CMOS transistor of claim 12, wherein the stress layer is a silicon nitride stress layer.

18. The method for fabricating a strained-silicon CMOS transistor of claim 12, wherein the stress layer is a high tensile stress film.

19. The method for fabricating a strained-silicon CMOS transistor of claim 12 further comprising:
   disposing a metal layer on the first transistor and the second transistor;
   performing a rapid thermal annealing process for forming a salicide layer on the first transistor and the second transistor; and
   removing the un-reacted metal layer.

20. The method for fabricating a strained-silicon CMOS transistor of claim 19 further comprising forming a contact etch stop layer on the first transistor and the second transistor after forming the salicide layer.

21. The method for fabricating a strained-silicon CMOS transistor of claim 12, wherein the epitaxial layer comprises silicon germanium.

* * * * *